United States Patent [19]

Abeles

[11] Patent Number: 5,003,359
[45] Date of Patent: Mar. 26, 1991

[54] OPTOELECTRONIC INTEGRATED CIRCUIT

[75] Inventor: Joseph H. Abeles, Highland Park, N.J.

[73] Assignee: David Sarnoff Research Center, Inc., Princeton, N.J.

[21] Appl. No.: 459,396

[22] Filed: Dec. 29, 1989

[51] Int. Cl.⁵ .............................................. H01L 31/12
[52] U.S. Cl. ......................................... 357/19; 357/17; 357/16; 372/50; 372/47
[58] Field of Search .................. 357/17, 19, 41, 16, 357/4; 372/50, 43, 44, 46, 47

[56] References Cited

U.S. PATENT DOCUMENTS

| | | | |
|---|---|---|---|
| 4,352,116 | 9/1982 | Yariv et al. | 357/17 |
| 4,361,887 | 11/1982 | Nakamura et al. | 372/50 |
| 4,366,567 | 12/1982 | Fukuzawa et al. | 372/38 |
| 4,603,420 | 7/1986 | Nishizawa et al. | 372/45 |
| 4,607,368 | 8/1986 | Hori | 372/45 |
| 4,608,696 | 8/1986 | Law et al. | 372/50 |
| 4,630,083 | 12/1986 | Yamakoshi | 357/17 |
| 4,716,125 | 12/1987 | Makiuchi | 357/17 |
| 4,719,498 | 1/1988 | Wada et al. | 357/30 |
| 4,766,472 | 8/1988 | Brillouet et al. | 372/50 |
| 4,787,089 | 11/1988 | Hayakawa et al. | 357/17 |
| 4,847,665 | 7/1989 | Mand | 372/50 |
| 4,884,119 | 11/1989 | Miller | 357/19 |

OTHER PUBLICATIONS

"Planar, Compitible OEIC's Based on Multiquantum Well Structures" by O. Wada et al., *IEEE Photonics Technology Letters*, vol. 1, No. 1, Jan. 1989, pp. 16-18.

Primary Examiner—Frank Gonzalez
Assistant Examiner—Susan S. Morse
Attorney, Agent, or Firm—William J. Burke

[57] ABSTRACT

The present invention relates to an optoelectronic integrated circuit having a substantially planar surface and which includes at least one laser diode and at least one field effect transistor. The integrated circuit comprises a substrate of semi-insulating GaAs having on a surface thereof in succession a first clad layer, a first confinement layer, a quantum well active layer, a second confinement layer, a second clad layer and an FET active layer. The FET active layer is of a material having good field effect transistor characteristics, such as N type GaAs or N type AlGaAs over a layer of undoped GaAs. The quantum well active layer is formed of alternating layers of undoped GaAs and a material which is capable of generating light of a wavelength longer than can be absorbed by the FET active layer, such as undoped InGaAs. The laser diode includes spaced contact regions of opposite conductivity type extending through the layers to the quantum well active layer. The field effect transistor comprises a groove in the FET active layer, a gate in the groove on the FET active layer and having a Schottky barrier contact with the FET active layer, and source and drain contacts on the FET active layer at opposite sides of the groove.

28 Claims, 3 Drawing Sheets

OPTOELECTRONIC INTEGRATED CIRCUIT

FIELD OF THE INVENTION

The present invention relates to an optoelectronic integrated circuit, and, more particularly, to a planar optoelectronic integrated circuit which includes at least one laser diode and at least one field effect transistor (FET).

BACKGROUND OF THE INVENTION

Semiconductor laser diodes are being used more widely in various types of optical communication systems because of their small size and relatively lower operating power as compared to other types of lasers. In such systems it is necessary to connect the laser diode to circuits formed of other electrical components, such as FETs, to properly operate the laser diode. In order to reduce the size of the system and to reduce the number of interconnections between the laser diode and the electrical components forming the circuit, it is desirable to form the laser diode and the electrical components as a monolithic integrated circuit. However, forming such an integrated circuit has several problems.

It is desirable that the integrated circuit be planar, i.e. have a planar surface, so as to facilitate forming the metallization pattern which connects the laser diode and the other electrical components on the surface of the device. In addition, laser diodes are generally formed of Group III-V materials so that it is necessary to form the integrated circuit and the other electrical components of the circuit of such materials. Of the Group III-V materials, GaAs is the most satisfactory material for forming FETs which have good operating characteristics. Therefore, the laser diode should be formed of Group III-V materials which are compatible with GaAs so that it can be satisfactorily formed on a substrate along with GaAs. However, in forming a laser diode and an FET in a monolithic body, it is necessary to isolate the FET and the laser diode both electrically and optically so that neither component interferes with the proper operation of the other.

SUMMARY OF THE INVENTION

The present invention relates to an optoelectronic integrated circuit formed in a body of a Group III-V semiconductor material having a surface. A FET active layer, such as of GaAs, is along the surface of the body and a field effect transistor is in the FET active layer. The body also includes a optically active layer extending thereacross substantially parallel to but spaced from the FET active layer. The optically active layer is of a material which is capable of generating or detecting light of a wavelength longer than can be absorbed by the material of the FET active layer. A field effect transistor is in the FET active layer and an optical device, such as a laser or a photodetector, is in the body and includes the optically active layer.

DETAILED DESCRIPTION

Figure 1:
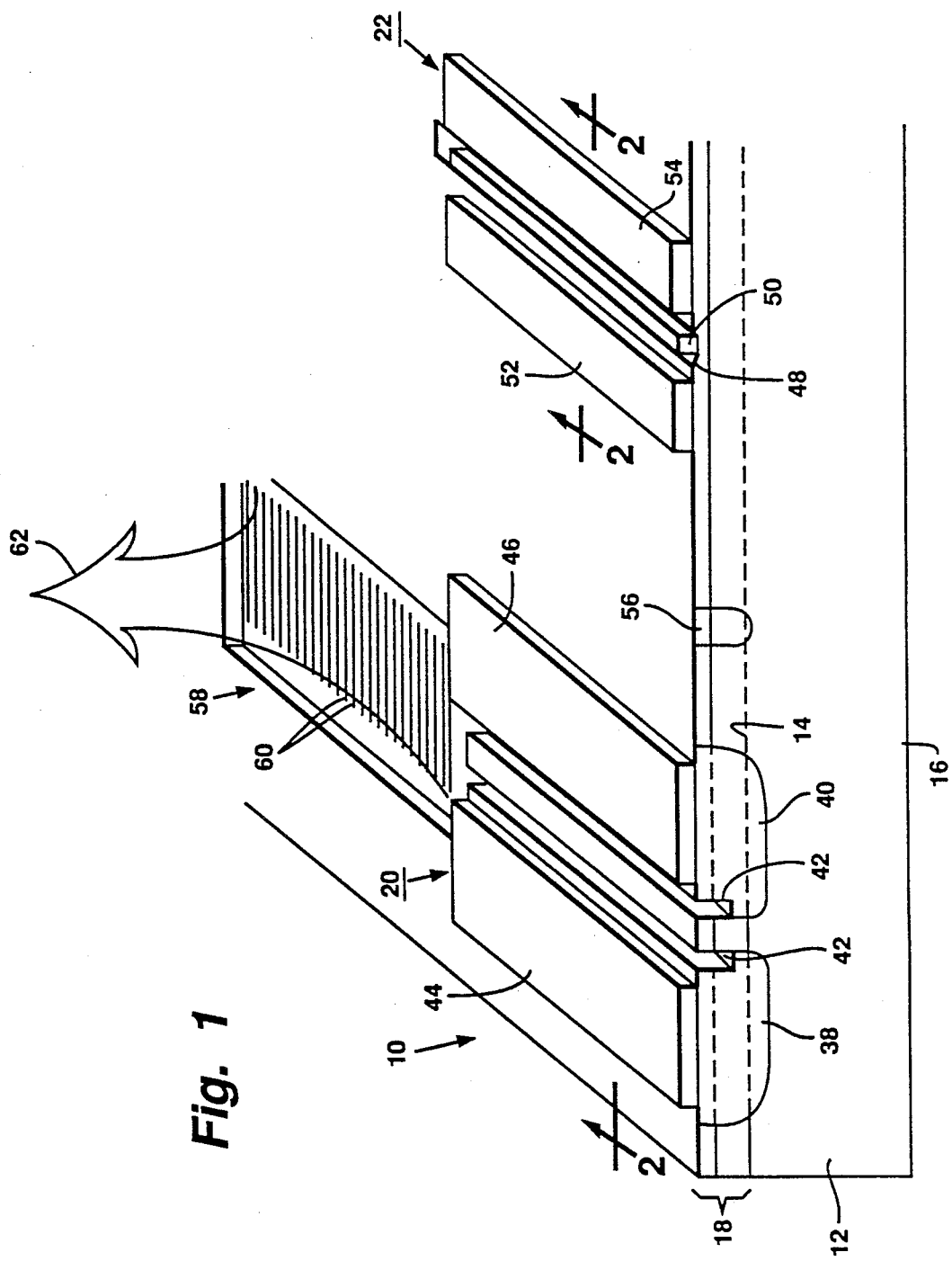
FIG. 1 is a perspective view of a portion of one form of the optoelectronic integrated circuit of the present invention.
Figure 2:
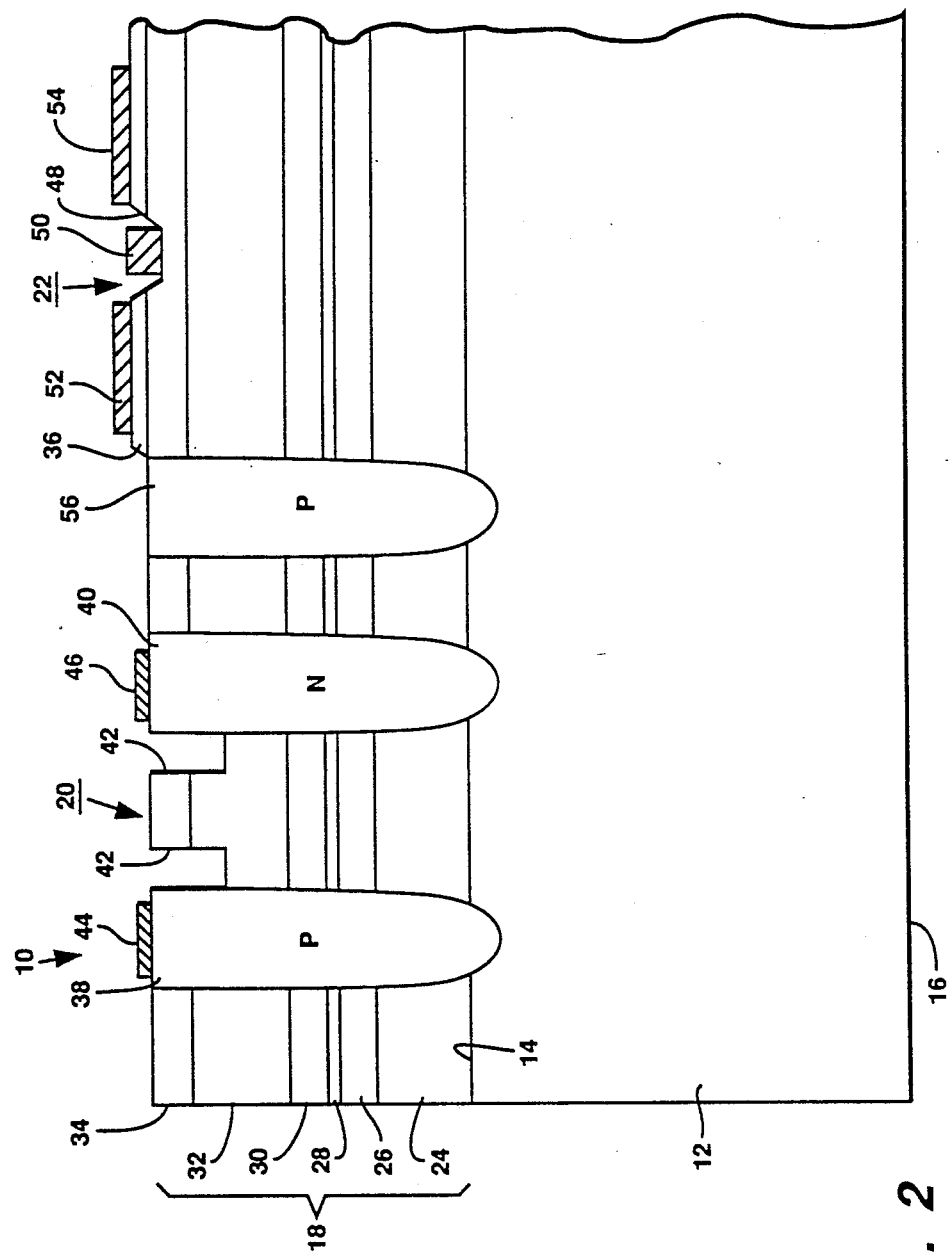
FIG. 2 is a sectional view taken along line 2—2 of FIG. 1.

Referring to FIGS. 1 and 2, there is shown a form of the optoelectronic integrated circuit 10 of the present invention. The integrated circuit 10 comprises a substrate 12 of a semi-insulating Group III-V semiconductor material, such as undoped GaAs, having opposed major surfaces 14 and 16. On the substrate surface 14 is a body 18 formed of Group III-V semiconductor materials. Within the body 18 is a laser diode 20 and a field effect transistor (FET) 22.

The body 18 is formed of a first clad layer 24 on the substrate surface 14, a first confinement layer 26 on the first clad layer 24, an active layer 28 on the first confinement layer 26, a second confinement layer 30 on the active layer 28, a second clad layer 32 on the second confinement layer 30, an FET active layer 34 on the second clad layer 32, and a contact layer 36 on the FET active layer 34. The clad layers 24 and 32 are typically composed of undoped $Al_{0.6}Ga_{0.4}As$ about 1000 Nanometers (nm) in thickness. The confinement layers 26 and 30 are of AlGaAs in which the aluminum content is typically graded from $Al_{0.6}Ga_{0.4}As$ at the clad layers 24 and 32 to $Al_{0.2}Ga_{0.8}As$ at the active layer 28. The confinement layers 26 and 28 are each typically about 200 nm in thickness.

The FET active layer 34 is typically composed of GaAs doped with a N type conductivity modifier, such as silicon, to a concentration of between about 1 and $2 \times 10^{17}$ per $cm^3$. The FET active layer is about 200 nm in thickness. The contact layer 36 is also doped with a N type conductivity modifier, such as silicon, but to a higher concentration so as to be N+ type. The contact layer 36 is between about 50 and 100 nm in thickness and extends only over the portion of the FET active layer 34 containing the FET 22. Although the FET active layer 34 is shown as being a single layer of N type GaAs, to form a modulation doped FET, the FET active layer 34 may be a quantum well comprising a layer of undoped GaAs of about 20 nm in thickness covered with a layer of N+ type $Al_{0.3}Ga_{0.7}As$ of about 40 nm thickness.

The active layer 28 is a multiple quantum well formed of alternating layers of GaAs and a Group III-V material which is capable of generating light of a wavelength longer than can be absorbed in GaAs, such as $In_{0.2}Ga_{0.8}As$. The active layer 28 is of a thickness of about 50 nm with the layers of the quantum well being about 8 nm in thickness. The layers of the quantum well at the confinement layers 26 and 30 are of GaAs.

The laser diode 20 includes all of the layers except the contact layer 36. A pair of spaced contact regions 38 and 40 extend through the layers 34, 32, 30, 28, 26 and 24 so as to define the laser diode 20 therebetween. The contact regions 38 and 40 are of opposite conductivity types. For example, the contact region 38 may be doped with zinc to make it P type and the contact region 40 may be doped with silicon to make it N type. The contact regions 38 and 40 disorder the quantum well active layer 28 and provide for carrier injection to generate light in the active layer 28. Spaced grooves 42 may be provided through the FET active layer 34 and into the second clad layer 32 to guide the formation of the contact regions 38 and 40. Metal contacts 44 and 46 are on the FET active layer 34 over and in ohmic contact with the contact regions 38 and 40 respectively.

The FET 22 comprises a groove 48 in the contact layer 36 and the FET active layer 34. A conductive metal gate 50 is on the FET active layer 34 in the groove 48 and forms a Schottky barrier junction with the FET active layer 34. Conductive source and drain contacts 52 and 54 are on the contact layer 36 on each side of the groove 48 and are in ohmic contact with the contact layer 34. An isolation region 56 may be provided through the body 18 between the laser diode 20 and FET 22 to electrically isolate them for each other. The isolation region 56 is a region is doped with zinc so as to be of P type conductivity.

In FIG. 2, the laser diode 20 is shown as being a surface emitting laser diode. For this purpose a grating 58 is provided at one or both ends of the laser diode 20. A portion of the FET active layer 34 is removed at one end of the laser diode 20 and a plurality of spaced, parallel grooves 60, such as V-shaped, are formed in the second clad layer 32 across the end of the laser diode 20. The grooves 60 have a period such that they will reflect some of the light passing from the laser diode 20 back into the laser diode 20 but will deflect some of the light out of the body 18 as indicated by the arrow 62. In an optoelectronic integrated circuit a surface emitting laser diode has the advantage that it can be placed anywhere in the body 18, particularly advantageous if the circuit contains a plurality of the laser diodes. However, if desired, the laser diode 20 can be an edge emitting laser diode wherein the light generated in the laser diode 20 is emitted from an side edge of the body 18.

To make the optoelectronic integrated circuit 10, the layers 24–36 of the body 18 are epitaxially grown on the substrate surface 14 in succession. This may be achieved by any well known technique for epitaxially growing the Group III–V materials, such as the metallo-organic chemical vapor deposition (MOCVD) technique or the molecular beam epitaxy (MBE) technique. Portions of the contact layer 36 may then be removed with a suitable etchant to leave the contact layer 36 only over the FET 22. An opening may then be formed in the FET active layer 34 where the grating 58 is to be formed. The grooves 42 and 48 may then be etched into the FET active layer 34 with the grooves 42 extending into the second clay layer 32.

The contact regions 38 and 40 may then be formed by diffusing the appropriate conductivity modifier through the layers of the body 18 on the sides of the grooves 42. The grooves 42 serve to concentrate the dopants close to the active layer 28 and thereby controlling the lateral dopant profile to leave a narrow undisordered region between the contact regions 38 and 40. This serves to enhance current confinement and lower the threshold for laser action, since the disordered regions exhibit higher a bandgap and create a quasielectric field which confines carriers laterially. Simultaneously, the grooves 42 are designed to enhance index guiding of the light flowing in the active layer. The isolation region 56 may be diffused through the body 18 at the same time as the N type contact region 38. The contacts 44 and 46 of the laser diode 20 and the gate, source and drain contacts 48, 50 and 52 of the FET 22 may be applied by evaporation in a vacuum or sputtering and defined by standard photolithographic techniques.

The layers 24, 26, 28, 30 and 32 along with the contacts 38 and 40 can alternatively be used as a photodetector by applying a reverse bias between the contacts 38 and 40. Light can be directed into the active layer 28, either directly or through the grating 58. The light is absorbed within the active layer 28 and converted to electrons. The integrated circuit 10 can include both a laser diode for emitting light and a photodetector for receiving light and converting the light to an electrical output. If the photodetector is to receive light emitted from the laser diode the photodetector must be capable of detecting light of the same wavelength as that emitted by the laser diode. In the integrated circuit 10 this can be satisfactorily achieved by using a grating for emitting light from the laser and receiving light for the photodetector.

Figure 3:
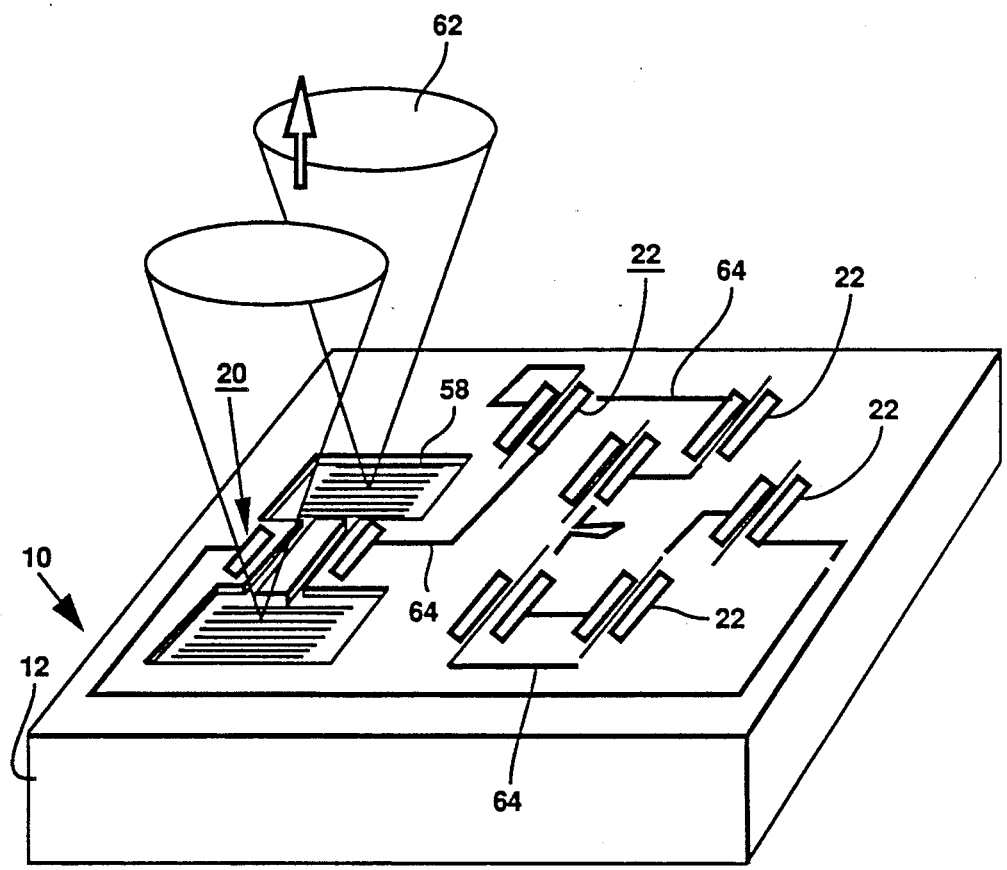
FIG. 3 is a perspective view of an optoelectronic integrated circuit of the present invention illustrating a typical circuit which can be formed therein.

Referring to FIG. 3, there is shown an optoelectronic integrated circuit 10 of the present invention which includes a surface emitting laser diode 20 having gratings 58 at each end thereof. The gratings 58 serve as mirrors to form the necessary cavity in the portion of the active layer 28 within the laser diode 20. In addition, the gratings 58 allow some of the light to be emitted from the integrated circuit 10. A plurality of FETs 22 are provided with a metallization pattern 64 of a conductive metal on the surface of the body 18 electrically connecting the FETs 22 to each other and to the laser diode 20 in a desired circuit.

Thus, there is provided by the present invention an optoelectronic integrated circuit 10 in which the FET 22 is formed in a Group III–V material, such as GaAs, which is highly suitable for providing FETs having good transconductance and saturation currents. However, the laser diode 20 is formed in Group III–V materials which are most suitable for generating light. In addition, the active layer 28 for the laser diode 20 is formed of a material, such as InGaAs, which generates light having a wavelength long enough so that it will not be absorbed by the material of the FET active layer 34. Thus, the light generated in the body 18 will not adversely affect the operation of the FET. Also, by having all of the layers beneath the FET active layer 34 undoped so as to be semi-insulating, there are no capacitive effects between the FET active layer 34 and the active layer 28 of the laser diode which can adversely affect the operation of either the FET 22 or the laser diode 20. In addition, the body 18 is substantially planar and all of the contacts for the laser diode 20 and the FET 22 are at the planar surface. Thus, the laser diode 20 and the FETs can be easily connected together in a desired circuit by a metallization pattern or the surface of the body 18. Also, this allows for high quality photolithography which is necessary to achieve short gate lengths, 0.5 micrometers, for high speed FETs.

What is claimed is:

1. An optoelectronic integrated circuit comprising:
a body of Group III–V semiconductor materials including a N type FET active layer along a surface thereof and a optically active layer extending across the body parallel to and spaced from the FET active layer, said optically active layer being of a semiconductor material which is capable of generating light of a wavelength longer than can be absorbed in the material of the FET active layer;
a field effect transistor in said FET active layer; and
a laser diode in said body including the optically active layer.

2. An optoelectronic integrated circuit in accordance with claim 1 in which the optically active layer is a quantum well layer.

3. An optoelectronic integrated circuit in accordance with claim 2 in which the quantum well layer comprises alternating layers of said semiconductor material and GaAs each of which is undoped.

4. An optoelectronic integrated circuit in accordance with claim 3 in which the semiconductor material of the quantum well layer is InGaAs.

5. An optoelectronic integrated circuit in accordance with claim 4 including undoped clad layers on each side of the laser active layer and the FET active layer is on one of the clad layers.

6. An optoelectronic integrated circuit in accordance with claim 5 in which each of the clad layers is of AlGaAs.

7. An optoelectronic integrated circuit in accordance with claim 6 including an undoped confinement layer between each of the clad layers and the optically active layer.

8. An optoelectronic integrated circuit in accordance with claim 7 in which each of the confinement layers is of AlGaAs in which the content of aluminum decreases from the clad layers to the optically active layer.

9. An optoelectronic integrated circuit in accordance with claim 8 including a pair of spaced contact regions extending through the body from the FET active layer to at least the optically active layer, one of said contact regions being of P type conductivity and the other being of N type conductivity.

10. An optoelectronic integrated circuit in accordance with claim 9 in which the laser diode includes a pair of spaced grooves extending through the body from the FET active layer into the clad layer adjacent the FET active layer and each of the contact regions is adjacent a separate one of said grooves.

11. An optoelectronic integrated circuit in accordance with claim 10 in which the field effect transistor includes a groove in the FET active layer, a gate in the groove and in Schottky barrier contact with the FET active layer, and source and drain contacts on the FET active layer at opposite sides of the groove.

12. An optoelectronic integrated circuit in accordance with claim 11 in which the FET active layer is of N type GaAs.

13. An optoelectronic integrated circuit in accordance with claim 11 in which the FET active layer is a layer of undoped GaAs on the clad layer and a layer of N type AlGaAs on the GaAs layer, and the groove is in the AlGaAs layer.

14. An optoelectronic integrated circuit in accordance with claim 11 including a conductive metallization pattern on the surface of the body electrically connecting the FET to the laser diode.

15. An optoelectronic integrated circuit in accordance with claim 14 including a plurality of FETs in the FET active layer and the metallization pattern electrically connects the FETs and the laser diode in a desired circuit.

16. An optoelectronic integrated circuit in accordance with claim 11 including a photodetector in said body, said photodetector including the optically active layer and a pair of spaced contacts extending through the body to the optically active layer.

17. An optoelectronic integrated circuit comprising:

a substrate of semi-insulating GaAs having a surface;
a first clad layer on the substrate surface;
a laser quantum well layer over the first clad layer;
a second clad layer over the quantum well layer;
an FET active layer of a Group III–V semiconductor material over the second clad layer;
a field effect transistor in said FET active layer; and
a laser diode including said clad layers and the quantum well layer;
said quantum well layer including a Group III–V semiconductor material which is capable of generating light of a wavelength longer than can be absorbed by the material of the FET active layer.

18. An optoelectronic integrated circuit in accordance with claim 17 in which the quantum well layer comprises alternating layers of undoped GaAs and undoped InGaAs.

19. An optoelectronic integrated circuit in accordance with claim 18 in which the clad layers are AlGaAs.

20. An optoelectronic integrated circuit in accordance with claim 19 in which the laser diode includes spaced contact regions extending through the FET active layer, the second clad layer and the quantum well layer, one of said contact regions being of P type conductivity and the other being of N type conductivity.

21. An optoelectronic integrated circuit in accordance with claim 20 in which the laser diode further includes spaced grooves extending through the FET active layer and the second clad layer, and each of the contact regions is along a separate one of said grooves.

22. An optoelectronic integrated circuit in accordance with claim 20 in which the field effect transistor comprises a groove in the FET active layer, a gate in the groove and having a Schottky barrier contact with the FET active layer, and source and drain contacts on the FET active layer at opposite sides of the groove.

23. An optoelectronic integrated circuit in accordance with claim 21 in which the FET active layer is N type GaAs.

24. An optoelectronic integrated circuit in accordance with claim 23 including a contact layer of highly conductive GaAs over the N type GaAs layer and the source and drain contacts are on the contact layer.

25. An optoelectronic integrated circuit in accordance with claim 22 in which the FET active layer comprises a layer of undoped GaAs on the second clad layer and a layer of N type AlGaAs on the GaAs layer and the groove is in the AlGaAs layer.

26. An optoelectronic integrated circuit in accordance with claim 22 including an isolation region of N type conductivity extending through the layers between the FET and the laser diode.

27. An optoelectronic integrated circuit in accordance with claim 22 including a conductive metallization pattern on the surface of the body electrically connecting the FET to the laser diode.

28. An optoelectronic integrated circuit in accordance with claim 27 including a plurality of FETs in the FET active layer and the metallization pattern electrically connects the FETs and the laser diode in a desired circuit.

* * * * *